United States Patent [19]
Kawakami et al.

[11] Patent Number: 5,710,082
[45] Date of Patent: Jan. 20, 1998

[54] GLASS COMPOSITION HAVING A LOW DIELECTRIC CONSTANT FOR HIGH-FREQUENCY CIRCUITS

[75] Inventors: Hiromichi Kawakami, Moriyama; Hiroji Tani, Nagaokakyo, both of Japan

[73] Assignee: Murata Manufacturing Co., Ltd., Kyoto-fu, Japan

[21] Appl. No.: 717,174

[22] Filed: Sep. 20, 1996

[30] Foreign Application Priority Data

Sep. 22, 1995 [JP] Japan .................................. 7-244023

[51] Int. Cl.$^6$ .................................. C03C 3/089
[52] U.S. Cl. .................................. 501/65; 501/21
[58] Field of Search .................................. 501/14, 21, 65, 501/66

[56] References Cited

U.S. PATENT DOCUMENTS

| | | | |
|---|---|---|---|
| 4,952,531 | 8/1990 | Cherukuri | 501/65 |
| 5,017,521 | 5/1991 | Yale et al. | 501/65 |
| 5,173,457 | 12/1992 | Shorthouse | 501/65 |
| 5,219,801 | 6/1993 | Shorrock et al. | 501/65 |
| 5,342,674 | 8/1994 | Tanei et al. | 501/65 |

*Primary Examiner*—Karl Group
*Attorney, Agent, or Firm*—Ostrolenk, Faber, Gerb & Soffen, LLP

[57] ABSTRACT

Disclosed herein is a glass composition having a dielectric constant for high-frequency circuits which comprises $SiO_2$ and at least one of $B_2O_3$ or $K_2O$ in a ratio falling within the region enclosed by lines passing through point A (65, 35, 0), point B (65, 20, 15), point C (85, 0, 15), and point D (85, 15, 0) in a composition diagram for the ternary system of $SiO_2$, $B_2O_3$ and $K_2O$. The glass composition may have incorporated with a small amount of clarifying so as to lower the melting temperature and glass softening point. As an insulating material, it is particularly suitable for high-frequency circuits in compact and fast electronic machines and equipment.

15 Claims, 1 Drawing Sheet

GLASS COMPOSITION HAVING A LOW DIELECTRIC CONSTANT FOR HIGH-FREQUENCY CIRCUITS

BACKGROUND OF THE INVENTION

1. Field of the Invention

The present invention relates to a glass composition having a low dielectric constant to be used as an electrical insulating material for high-frequency circuits.

2. Description of the Prior Art

The recent trend toward compactor and faster electronic machines and equipment has stimulated a demand for electrical insulating materials having low dielectric constants for high-frequency circuits. Such insulating materials are used to form an insulating layer on the surface of an insulating substrate made of, for example, alumna. The insulating layer supports a circuit pattern formed thereon.

It has been common practice to make insulating layers having low dielectric constants from an epoxy resin-based material. Unfortunately, resin-based insulating materials are poor in durability at high temperatures.

SUMMARY OF THE INVENTION

The object of the present invention, which was completed in view of the foregoing, is to provide a new electrical insulating material which has a low dielectric constant and is superior in durability at high temperatures. In the present invention, the electrical insulating material is a glass composition having a low dielectric constant rather than a resin-based material. The glass composition according to the present invention, comprises $SiO_2$ and at least one of $B_2O_3$ or $K_2O$ in a ratio falling within the region enclosed by lines passing through point A (65, 35, 0), point B (65, 20, 15), point C (85, 0, 15), and point D (85, 15, 0) in a composition diagram for the ternary system of $SiO_2$, $B_2O_3$, and $K_2O$.

DETAILED DESCRIPTION OF THE INVENTION

Figure 1:
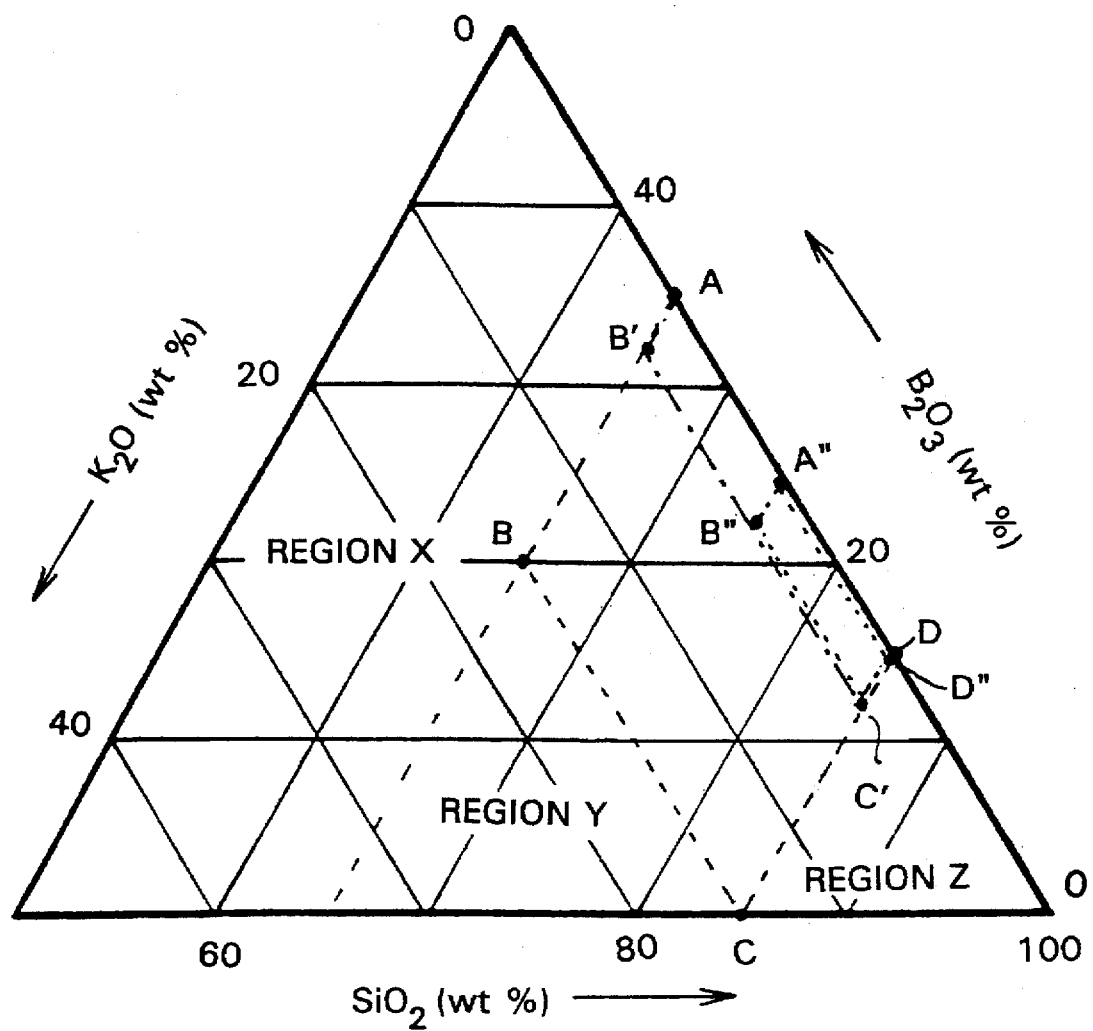
FIG. 1 is a composition diagram showing in a ternary system the ratio of the constituents of the glass composition having a low dielectric constant for high-frequency circuits pertaining to the present invention.

The gist of the present invention resides in a glass composition having a low dielectric constant for high-frequency circuits which comprises $SiO_2$ and at least one of $B_2O_3$ or $K_2O$ in a ratio falling within the region enclosed by lines passing through point A (65, 35, 0), point B (65, 20, 15), point C (85, 0, 15), and point D (85, 15, 0) in the composition diagram for the ternary system as shown in FIG. 1.

The present invention may be modified such that the glass composition contains, in addition to the above-mentioned major constituents ($SiO_2$, $B_2O_3$, and $K_2O$), at least one kind of clarifying agent selected from the group consisting of $As_2O_3$, $As_2O_5$, $Sb_2O_3$, and $Na_2SO_4$ in an amount of less than about 2 wt % of the total amount of the major constituents.

The clarifying agent lowers the melting point and softening point of the glass composition. The lowered melting point leads to the extended life of platinum crucibles or the like in which the material is melted in the manufacturing process.

EXAMPLES

A mixture of glass raw materials was prepared from $SiO_2$, $B_2O_3$, $K_2CO_3$, $As_2O_3$, $As_2O_5$, $Sb_2O_3$, and $Na_2SO_4$ according to the formula shown in Table 1. The resulting mixture was melted at the temperature specified in Table 1. Note that this temperature is not the melting point of the glass composition but the temperature at which the mixture would have melted.

The resulting molten glass was cast into a mold. The resulting mass was annealed to remove stress. The annealed mass was cut into specimens for measurement of physical properties. The softening point of the sample is shown in Table 1.

TABLE 1

| Sample No. | Formula for glass composition | | | | | | | Melting point (°C.) | Softening point (°C.) |
|---|---|---|---|---|---|---|---|---|---|
| | $SiO_2$ | $B_2O_2$ | $K_2O$ | $As_2O_3$ | $As_2O_5$ | $Sb_2O_3$ | $Na_2SO_4$ | | |
| 1* | 60 | 30 | 10 | — | — | — | — | 1500 | 700 |
| 2 | 65 | 35 | 0 | — | — | — | — | 1500 | 680 |
| 3 | 85 | — | 15 | — | — | — | — | 1750 | 1050 |
| 4 | 85 | 15 | — | — | — | — | — | 1500 | 950 |
| 5 | 70 | 28 | 2 | — | — | — | — | 1500 | 720 |
| 6 | 75 | 23 | 2 | — | — | — | — | 1500 | 760 |
| 7 | 79 | 19 | 2 | — | — | — | — | 1600 | 800 |
| 8 | 83 | 10 | 7 | — | — | — | — | 1500 | 950 |
| 9 | 65 | 20 | 15 | — | — | — | — | 1500 | 720 |
| 10* | 70 | 10 | 20 | — | — | — | — | 1500 | 710 |
| 11* | 90 | 5 | 5 | — | — | — | — | 1500 | >1050 |
| 12 | 79 | 19 | 2 | 2 | — | — | — | 1500 | 730 |
| 13 | 79 | 19 | 2 | — | 2 | — | — | 1500 | 730 |
| 14 | 79 | 19 | 2 | — | — | 2 | — | 1500 | 730 |
| 15 | 79 | 19 | 2 | — | — | — | 2 | 1500 | 730 |
| 16 | 85 | — | 15 | — | — | — | 2 | 1600 | 980 |

*Outside the scope of the present invention.

Each specimen was tested for dielectric properties and load insulating properties in wet condition by measuring the electrostatic capacity and dielectric loss (tan δ) at 1 MHz, 1 $V_{rms}$, and 25° C. and at 3 GHz through a vibration method. The relative dielectric constant ($\epsilon_r$) of the specimen was calculated from the electrostatic capacity obtained and the dimensions of the capacitor used. The insulating resistance (IR) of the specimen was measured by application of a voltage of 50 V for 1000 hours at 85° C. and 85% RH and subsequent application of 100 V (DC) for 1 minute. Also, the sample was pulverized and the resulting powder was heated at temperatures below 1050° C. to see if it was capable of sintering. The results of these tests are shown in Table 2.

$B_2O_3$ or $K_2O$. Samples 12 to 15 are identical with sample 7 in the formula of the three major constituents; however, they additionally include 2 wt % each of $As_2O_3$, $As_3O_5$, $Sb_2O_3$ and $Na_2SO_4$, respectively. Sample 16 is identical with

TABLE 2

| Sample No. | Relative dielectric constant ($\epsilon_r$) at 1 MHz | Dielectric loss tan δ (%) at 1 MHz | Relative dielectric constant ($\epsilon_r$) at 3 GHz | Dielectric loss tan δ (%) at 3 GHz | Insulation resistance lig IR | Capability of sintering below 1050° C. |
|---|---|---|---|---|---|---|
| 1* | 5.3 | 0.1 | 5.3 | 0.005 | <10 | yes |
| 2 | 3.9 | 0.1 | 3.9 | 0.003 | >10 | yes |
| 3 | 6.2 | 0.3 | 6.2 | 0.005 | >12 | yes |
| 4 | 3.7 | 0.1 | 3.7 | 0.001 | >12 | yes |
| 5 | 4.0 | 0.1 | 4.1 | 0.001 | >12 | yes |
| 6 | 4.0 | 0.1 | 4.0 | 0.001 | >12 | yes |
| 7 | 3.8 | 0.1 | 3.8 | 0.001 | >12 | yes |
| 8 | 5.6 | 0.3 | 5.7 | 0.006 | >12 | yes |
| 9 | 6.2 | 0.3 | 6.1 | 0.006 | >12 | yes |
| 10* | 7.1 | 0.4 | 7.0 | 0.008 | >10 | yes |
| 11* | 4.2 | 0.2 | 4.2 | 0.004 | >12 | no |
| 12 | 4.0 | 0.1 | 4.0 | 0.001 | >12 | yes |
| 13 | 4.9 | 0.1 | 4.9 | 0.001 | >12 | yes |
| 14 | 5.0 | 0.1 | 5.0 | 0.001 | >12 | yes |
| 15 | 5.1 | 0.2 | 5.1 | 0.005 | >12 | yes |
| 16 | 7.0 | 0.3 | 6.9 | 0.006 | >12 | yes |

*Outside the scope of the present invention.

Based on the characteristic properties shown in Tables 1 and 2, the desired formula for $SiO_2$, $B_2O_3$, and $K_2O$ was established as shown in FIG. 1. According to the present invention, a glass composition having a low dielectric constant for high-frequency circuits contains $SiO_2$ and at least one of $B_2O_3$ or $K_2O$ in a ratio falling within the region enclosed by lines passing through point A (65, 35, 0), point B (65, 20, 15), point C (85, 0, 15), and point D (85, 15, 0) in the composition diagram for the ternary system as shown in FIG. 1.

Samples 1 to 11 in Tables 1 and 2 do not contain any clarifying agent such $As_2O_3$, $As_2O_5$, $Sb_2O_3$ or $Na_2SO_4$. Samples 2 to 9 conform to the present invention, but samples 1, 10 and 11 are outside the scope of the present invention. Samples 1, 10 and 11 are based on the respective formulas falling within regions X, Y, and Z in FIG. 1.

Sample 1 of the formula falling within region X has a insulating resistance less than $1 \times 10^{10}$ Ω (log IR>10), as shown in Table 2, which means poor insulating properties in wet condition. Sample 10 of the formula falling within region Y has an undesirably high relative dielectric constant (more than 7) as shown in Table 2. Sample 11 of the formula falling within region Z has a softening point higher than 1050° C as shown in Table 1 and is incapable of sintering at 1050° C. as shown in Table 2. This suggests that it is poor in processability.

According to the detailed analysis of the obtained test results, it is preferable that the ratio of the glass composition falls within the region enclosed by lines passing through point A (65, 35, 0), point B (65, 32, 3), point C' (85, 12, 3) and D (85, 15, 0), and more preferably, A" (75, 24.5, 0.5), point B" (75, 22, 3), point C' (85, 12, 3) and D" (85, 14.5, 0.5). In these cases, a glass composition having a lower dielectric constant of about or less than 4 is obtained.

Samples 12 to 16 in Tables 1 and 2 are combined with a clarifying agent in an amount of 2 wt % of the total amount of the major constituents, that is, $SiO_2$ and at least one of sample 3 in the formula of the two major constituents ($SiO_2$ and $K_3O$); however, it is additionally contains 2 wt % of $Na_2SO_4$.

Comparison of samples 12–15 with sample 7 or comparison of sample 16 with sample 3 indicates that less than 2 wt % of the clarifying agent lowers the melting temperature and softening point as shown in Table 1. However, as shown in Table 2, the dielectric constants of the samples 12–16 are somewhat greater than that of sample 7 or sample 3. Thus, in order to prevent the dielectric constant from increasing, it is preferable that the content of the clarifying agent is in the range of about 0.05 to 0.5 wt %, and more preferably, about 0.05 to 0.2 wt %.

As shown in the Examples, the inventive composition has a low dielectric constant and exhibits high reliability in the load test in wet condition. It has a low glass softening point (below 1050° C.) and hence is capable of sintering at comparatively low temperatures (below 1050° C.). Therefore, it can be easily formed into an electrically insulating layer on an insulating substrate such as ceramics multilayer substrate and dielectric substrate. As an insulating material, it is particularly suitable for high-frequency circuits in compact and fast electronic machines and equipment. Accordingly, The glass composition of the present is superior to resin-based materials in durability at high temperatures.

What is claimed is:

1. A glass composition consisting of $SiO_2$, at least one of $B_2O_3$ or $K_2O$ and at least one of refining agent, wherein the ratio of said $SiO_2$, $B_2O_3$ and $K_2O$ falls within the region enclosed by lines passing through point A (65, 35, 0), point B (65, 20, 15), point C (85, 0, 15) and point D (85, 15, 0) in a composition diagram for the ternary system of $SiO_2$, $B_2O_3$ and $K_2O$ aligned along the x, y and z axes, respectively, and based on weight percentage, and wherein said refining agent is selected from the group consisting of $As_2O_3$, $As_2O_5$, $Sb_2O_3$ and $Na_2SO_4$ in an amount less than 2 wt % of the total amount of $SiO_2$, $B_2O_3$ and $K_2O$.

2. The glass composition according to claim 1, wherein said refining agent amount is about 0.05–0.5 wt % of the total amount of $SiO_3$, $B_2O_3$ and $K_3O$.

3. The glass composition according to claim 1, wherein said refining agent amount is about 0.05–0.2 wt % of the total amount of $SiO_2$, $B_2O_3$ and $K_2O$.

4. The glass composition according to claim 1 wherein said region is enclosed by lines passing through point A (65, 35, 0), point B' (65, 32, 3), point C' (85, 12, 3) and point D (85, 15, 0).

5. The glass composition according to claim 4, wherein said refining agent amount is about 0.05–0.5% of the total amount of $SiO_2$, $B_2O_3$ and $K_2O$.

6. The glass composition according to claim 4, wherein said refining agent amount is about 0.05–0.2 wt % of the total amount of $SiO_2$, $B_2O_3$ and $K_2O$.

7. The glass composition of claim 1 wherein the region is enclosed by lines passing through point A" (75, 24.5, 0.5), point B" (75, 22, 3), point C' (85, 12, 3) and point D" (85, 14.5, 0.5).

8. The glass composition according to claim 7, wherein said refining agent amount is about 0.05–0.5 wt % of the total amount of $SiO_2$, $B_2O_3$ and $K_2O$.

9. The glass composition according to claim 7, wherein said refining agent amount is about 0.05–0.2 wt % of the total amount of $SiO_2$, $B_2O_3$ and $K_2O$.

10. In an electronic device containing an area of insulating material, the improvement which comprises the insulating material being the glass of claim 1.

11. In an electronic device containing an area of insulating material, the improvement which comprises the insulating material being the glass of claim 3.

12. In an electronic device containing an area of insulating material, the improvement which comprises the insulating material being the glass of claim 4.

13. In an electronic device containing an area of insulating-material, the improvement which comprises the insulating material being the glass of claim 7.

14. In an electronic device containing an area of insulating material, the improvement which comprises the insulating material being the glass of claim 8.

15. In an electronic device containing an area of insulating material, the improvement which comprises the insulating material being the glass of claim 9.

* * * * *